United States Patent [19]
Van Den Brink et al.

[11] Patent Number: 6,076,006
[45] Date of Patent: Jun. 13, 2000

[54] DIFFUSION-WEIGHTED MRI METHOD

[75] Inventors: Johan S. Van Den Brink; Arianne M. C. Van Muiswinkel, both of Eindhoven, Netherlands

[73] Assignee: U.S. Philips Corporation, New York, N.Y.

[21] Appl. No.: 09/057,500

[22] Filed: Apr. 9, 1998

[30] Foreign Application Priority Data

Apr. 17, 1997 [EP] European Pat. Off. .............. 97201136

[51] Int. Cl.$^7$ ................................................. A61B 5/055
[52] U.S. Cl. .......................................... 600/419; 324/309
[58] Field of Search ........................... 600/410; 324/307, 324/309

[56] References Cited

U.S. PATENT DOCUMENTS

| | | | |
|---|---|---|---|
| 4,937,526 | 6/1990 | Ehman et al. | 324/309 |
| 5,539,312 | 7/1996 | Fu et al. | 324/309 |
| 5,800,354 | 9/1998 | Hofland et al. | 600/410 |
| 5,833,609 | 11/1998 | Dannels et al. | 600/410 |
| 5,926,021 | 7/1999 | Hennig | 324/306 |
| 5,928,146 | 7/1999 | Itagaki et al. | 600/410 |

OTHER PUBLICATIONS

By K. Butts et al., "Diffusion–Weighted Interleaved Echo–Planner Imaging with a Pair of Orhtogonal Navigator Echoes", Magnetic Resonance in Medicine, 1996 No. 35, pp. 763–770.

*Primary Examiner*—Brian L. Casler
*Attorney, Agent, or Firm*—Dwight H. Renfrew

[57] ABSTRACT

A diffusion weighted MR method for forming images of diffusion of spins in biological tissue. In order to correct macroscopic motions, the MR method measures navigator MR signals wherefrom a phase correction is derived for the MR signals. During the imaging of, for example a part of the brain of a human or animal, artefacts may arise at the areas of the image which correspond to regions in the part of the brain which contain CSF. The artefacts in the MR image can be reduced by determining a corrected phase, for measuring points having a modulus smaller than the threshold value, from the phases of different reference measuring points of the navigator MR signal for which the phase can be determined with a sufficiently small error.

10 Claims, 5 Drawing Sheets

DIFFUSION-WEIGHTED MRI METHOD

The invention relates to a magnetic resonance (MR) method for the imaging of an object arranged in a steady magnetic field, the following steps being repeatedly executed according to said method:

excitation of spins in a part of the object;

measurement of MR signals along a predetermined trajectory containing a plurality of lines in k-space by application of a read gradient and other gradients. application of a navigator gradient for the measurement of navigator MR signals and application of an additional gradient in order to achieve diffusion sensitivity of the MR signal, said method also including the determination of a phase correction from phases and moduli of the measured navigator MR signals so as to correct the measured MR signals and the determination of an image of the part of the object from the corrected MR signals.

The invention also relates to an MR device for carrying out such a method.

A method of the kind set forth is known from the article "Diffusion-Weighted Interleaved Echo-Planar Imaging with a Pair of Orthogonal Navigator Echoes" by K. Butts et al, published in Magnetic Resonance in Medicine, No. 35, pp. 763–770, 1996. In the context of a k-space is to be understood as a spatial frequency domain in which a predetermined trajectory is followed by the application of gradients to the static magnetic field. The lines of the trajectory are connecting sample points, which positions are determined by a time integral of the applied gradients during an interval from excitation of the spins until an instant in time at which the MR signal is measured. The measured values produce the inverse Fourier transformed values of an image of the object. Furthermore, gradients are to be understood as temporary magnetic fields which are superposed on a steady magnetic field and cause a gradient in the steady magnetic field in three respective orthogonal directions. A gradient in the first direction is generally referred to as a read out gradient, a gradient in the second direction as a phase encoding gradient and a gradient in the third direction as a selection gradient.

The known method is applied in medical diagnostics so as to acquire MR images of diffusion phenomena in the tissue of the part of the body, for example a part of the brain of a human or animal. According to the known method, an additional gradient which includes a bipolar gradient having a high b-value is applied. This results in an increased sensitivity of the MR signal to spins which move due to diffusion in the tissue to be imaged. The measured MR signals are corrected for macroscopic motion by means of a phase correction. Such phase correction is determined from the phases of the measured navigator MR signals. After this correction, an image of the part of the brain is reconstructed. It is a drawback of the known method that strip-shaped artefacts are liable to occur at areas in the reconstructed image which correspond to regions in the brain which contain a large quantity of cerebrospinal fluid (CSF).

It is an object of the invention to counteract these artefacts. To achieve this, the method according to the invention is characterized in that a corrected phase is determined for a measured navigator MR signal from a measuring point, for which the modulus of the measured navigator MR signal is smaller than a threshold value, from the phases of the measured navigator MR signal from different reference measuring points for which the moduli of the navigator MR signal exceed the threshold value. The invention is based on the recognition of the fact that the presence of a strong diffusion motion due to a high value of the additional gradient reduces the value of the moduli of the measuring points in the navigator MR signal which correspond to regions of the brain which contain a large quantity of CSF. Because of the low value of the moduli, the error in the determination of the phase increases. It has been found that the artefacts in the MR image can be reduced when for the measuring points having a modulus smaller than the threshold value the corrected phase is determined from the phases of the various reference measuring points of the navigator MR signal for which the phase can be determined with a sufficiently small error.

A special version of the method according to the invention is characterized in that the corrected phase of the measured navigator MR signal from the measuring point is determined by interpolation of the phases of the measured navigator MR signal from neighboring reference measuring points. The phase of the measuring points for which the modulus of the measured navigator MR signal is smaller than the threshold value can thus be simply determined. In this respect it is assumed that the phase of the measured navigator MR signal varies, for example as a linear function of the distance in the direction of the navigator gradient.

A further version of the method according to the invention is characterized in that the corrected phase of the measured navigator MR signal from the measuring point is estimated by interpolation of the mean phase of the phases of the measured navigator MR signal from different reference measuring points for which the value of a co-ordinate in a direction of the navigator gradient is smaller than the corresponding co-ordinate of the measuring point and the mean phase of the phases of the measured navigator MR signal from different reference measuring points for which the value of a co-ordinate in a direction of the navigator gradient is larger than the corresponding co-ordinate of the measuring point. This step ensures that the phases of a reference measuring point having a small co-ordinate and the phase of a reference measuring point having a co-ordinate larger than the corresponding co-ordinate of the measuring point, the modulus of said reference measuring points satisfying the condition imposed, are taken into account to a limited extent only in determining the corrected phase of the measuring point, thus reducing possible errors which are due to a phase which deviates from the expected phase variation because of a strongly varying modulus of said reference measuring points.

A further version of the method according to the invention is characterized in that a linear interpolation or a higher-order interpolation is used for determining the corrected phase. A linear or higher-order interpolation can be used in dependence on the expected phase variation of the navigator MR signal as a function of the distance in the direction of the navigator gradient, the interpolation function being in correspondence with the phases determined for the reference points.

A further version of the method according to the invention is characterized in that the threshold value is determined by a function of a maximum value of the moduli of the measured navigator MR signal. The maximum value of the moduli of the measured navigator MR signal divided by two is an example of such a function. This step determines a part of the navigator MR signal for which the phase of the measured navigator MR signal is inaccurate.

A further version of the method according to the invention is characterized in that the additional gradient contains a bipolar gradient. The bipolar gradient is a gradient enabling measurement of a displacement due to diffusion of the spins in the tissue in the direction of the gradient.

A further version of the method according to the invention is characterized in that a refocusing RF pulse is generated at the temporal center of the bipolar gradient. Due to the generating of this refocusing RF pulse, a measurement of the transverse relaxation time $T_2$ is obtained instead of the time constant $T^*_2$ of the free induction decay signal.

A further version of the method according to the invention is characterized in that two 90° RF pulses with an interval TM are generated at the temporal center of the bipolar gradient. As a result of this step, high b-values of the additional gradient can be achieved; a high signal-to-noise ratio can then also be achieved for measurements on biological tissue with a longitudinal relaxation time $T_1$, of the magnetization which exceeds the transverse relaxation time $T_2$ of the magnetization.

A further version of the method according to the invention is characterized in that an inversion recovery RF pulse is generated a period of time TI before the excitation. A 180° RF pulse is an example of such an inversion recovery pulse. The period of time TI between the inversion recovery RF pulse and the excitation by means of an RF pulse can be chosen to be such that the contrast between different types of tissue is enhanced.

The invention also relates to an MR device which is characterized in that the processing unit also includes means for determining a threshold value of moduli of the measured navigator MR signal, and correction means for determining a corrected phase of a measured navigator MR signal from a measuring point for which a modulus of the measured navigator MR signal is smaller than the threshold value from the phases of the measured navigator MR signal from different reference measuring points for which the moduli of the navigator MR signal are larger than the threshold value.

The above and other, more detailed aspects of the invention will be described in detail hereinafter, by way of example, with reference to the drawing.

Figure 3:
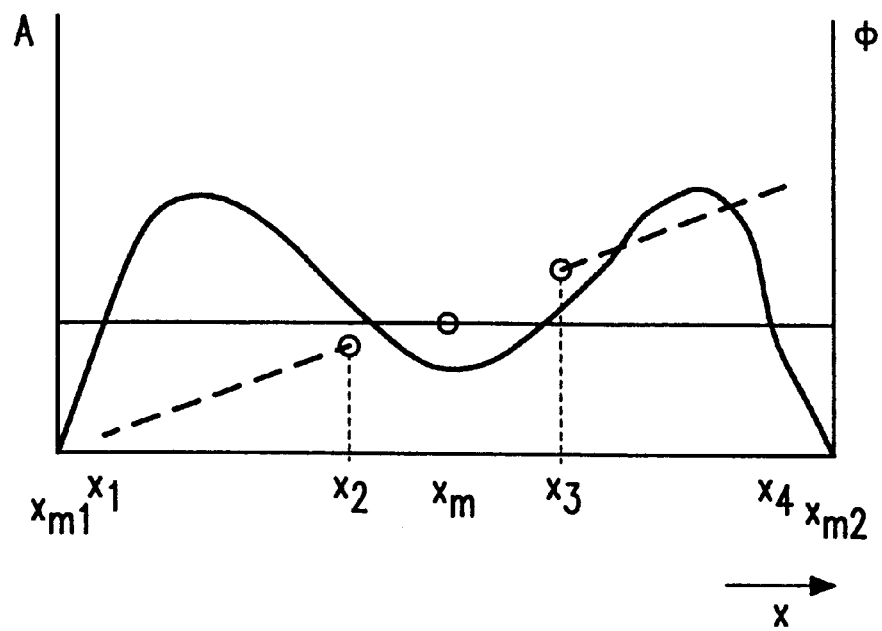
Figure 4:
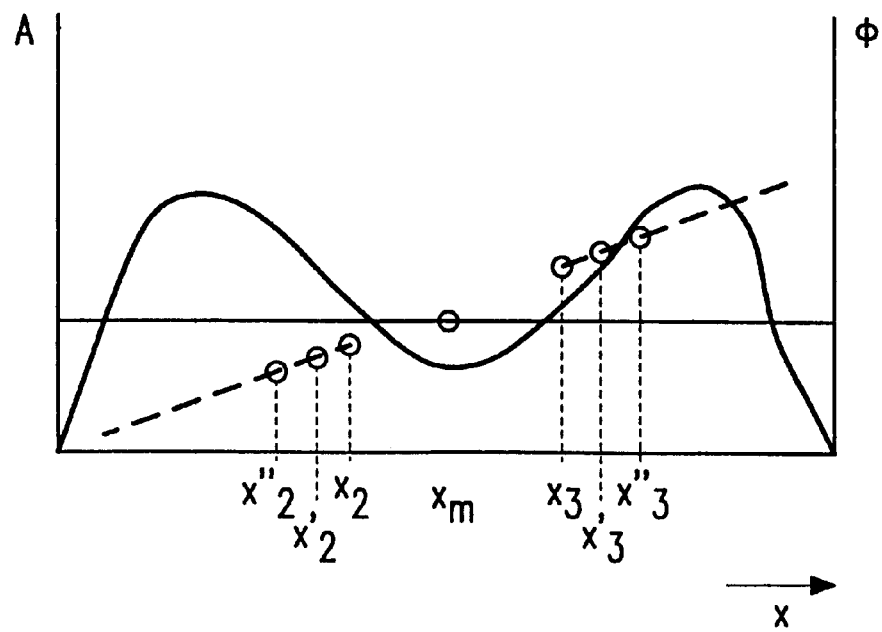
Figure 5:
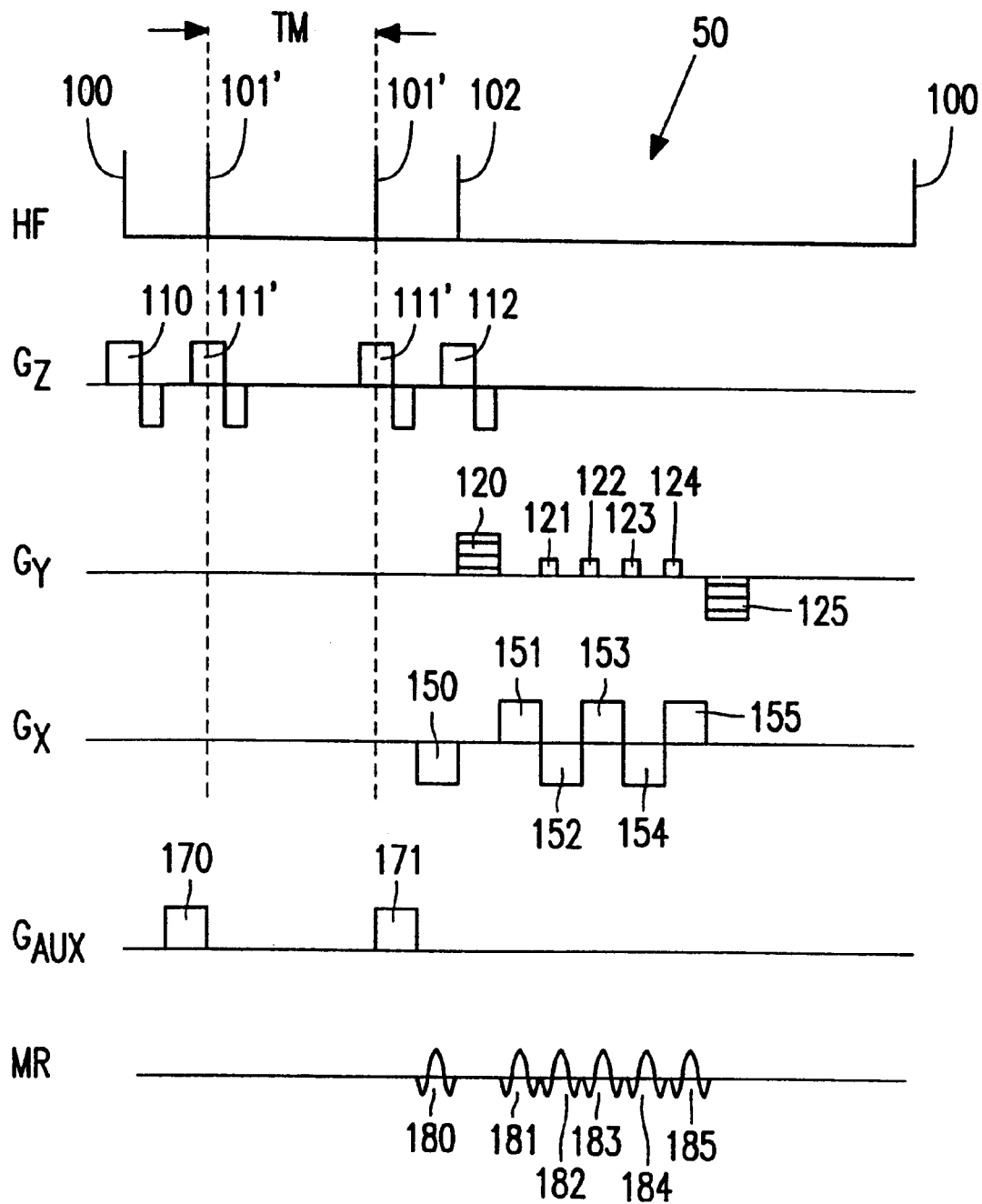
Figure 6:
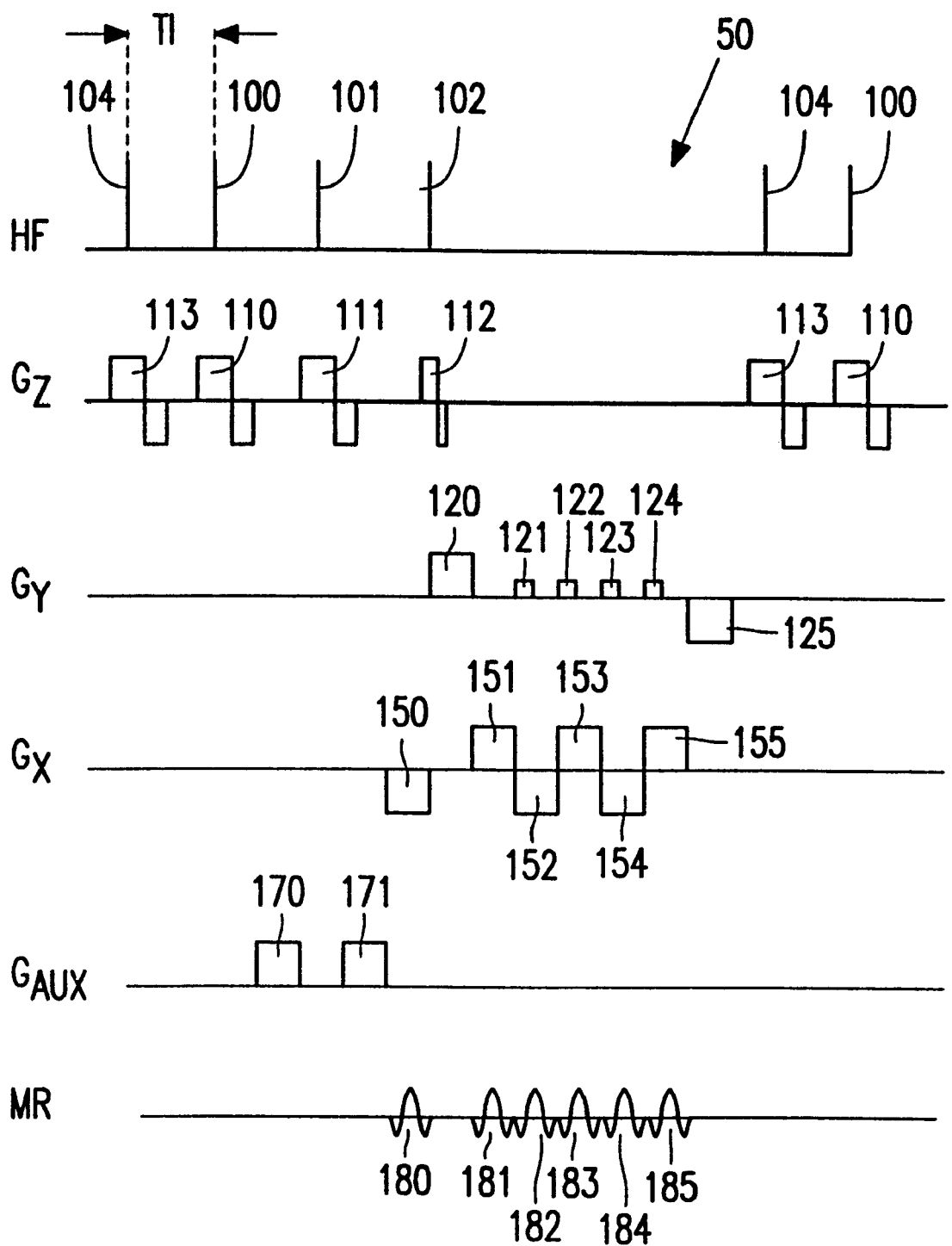

FIG. 3 shows a graph illustrating a first version of the method for determining the phase of a measured navigator MR signal from a measuring point with a small value of the modulus, FIG. 4 shows a graph illustrating a second version of the method for determining the phase of a measured navigator MR signal from a measuring point with a small value of the modulus, FIG. 5 shows a pulse sequence containing two 90° RF pulses and the additional gradient, and FIG. 6 shows a pulse sequence containing an inversion recovery RF pulse prior to an excitation RF pulse.

Figure 1:
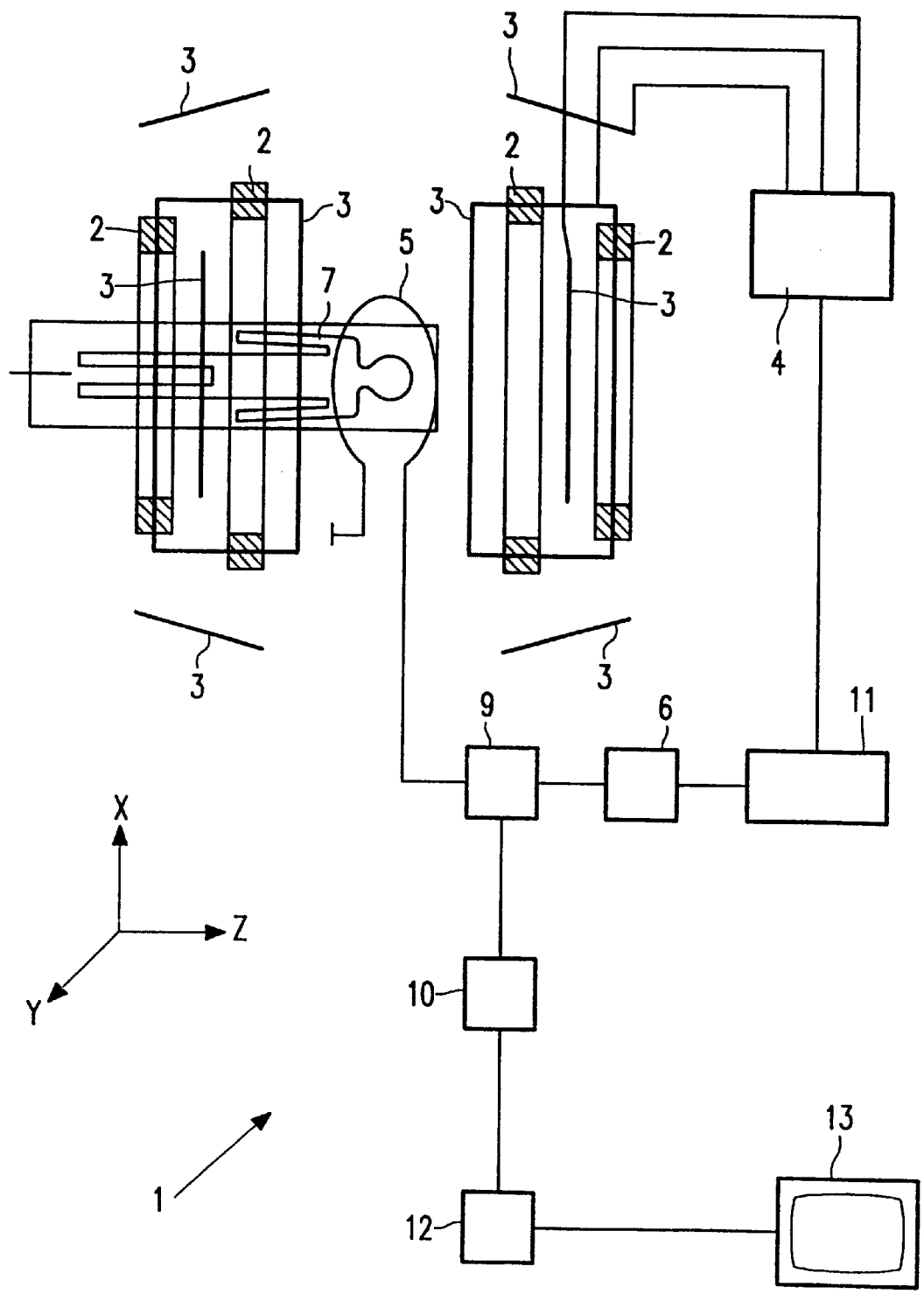
FIG. 1 shows an MR device.

FIG. 1 shows a magnetic resonance device which includes a first magnet system 2 for generating a steady magnetic field, and also several gradient coils 3 for generating additional magnetic fields having a gradient in the X, Y, Z directions. The Z direction of the co-ordinate system shown corresponds to the direction of the steady magnetic field in the magnet system 2 by convention. The measuring co-ordinate system x, y, z to be used can be chosen independently of the X, Y, Z system shown in FIG. 1. The gradient coils are fed by a power supply unit 4. An RF transmitter coil 5 serves to generate RF magnetic fields and is connected to an RF transmitter and modulator 6. A receiver coil is used to receive the magnetic resonance signal generated by the RF field in the object 7 to be examined, for example a human or animal body. This coil may be the same coil as the RF transmitter coil 5. Furthermore, the magnet system 2 encloses an examination space which is large enough to accommodate a part of the body 7 to be examined. The RF coil 5 is arranged around or on the part of the body 7 to be examined in this examination space. The RF transmitter coil 5 is connected to a signal amplifier and demodulation unit 10 via a transmission/reception circuit 9. The control unit 11 controls the RF transmitter and modulator 6 and the power supply unit 4 so as to generate special pulse sequences which contain RF pulses and gradients. The phase and amplitude obtained from the demodulation unit 10 are applied to a processing unit 12. The processing unit 12 processes the presented signal values so as to form an image by transformation. This image can be visualized, for example by means of a monitor 13.

The invention will be described hereinafter, by way of example, on the basis of versions of a method in which diffusion weighting is used in combination with a known echo planar imaging (EPI) pulse sequence so as to generate an MR signal. These EPI pulse sequences can be used to form an image by means of a two-dimensional or three-dimensional Fourier imaging technique.

Figure 2:
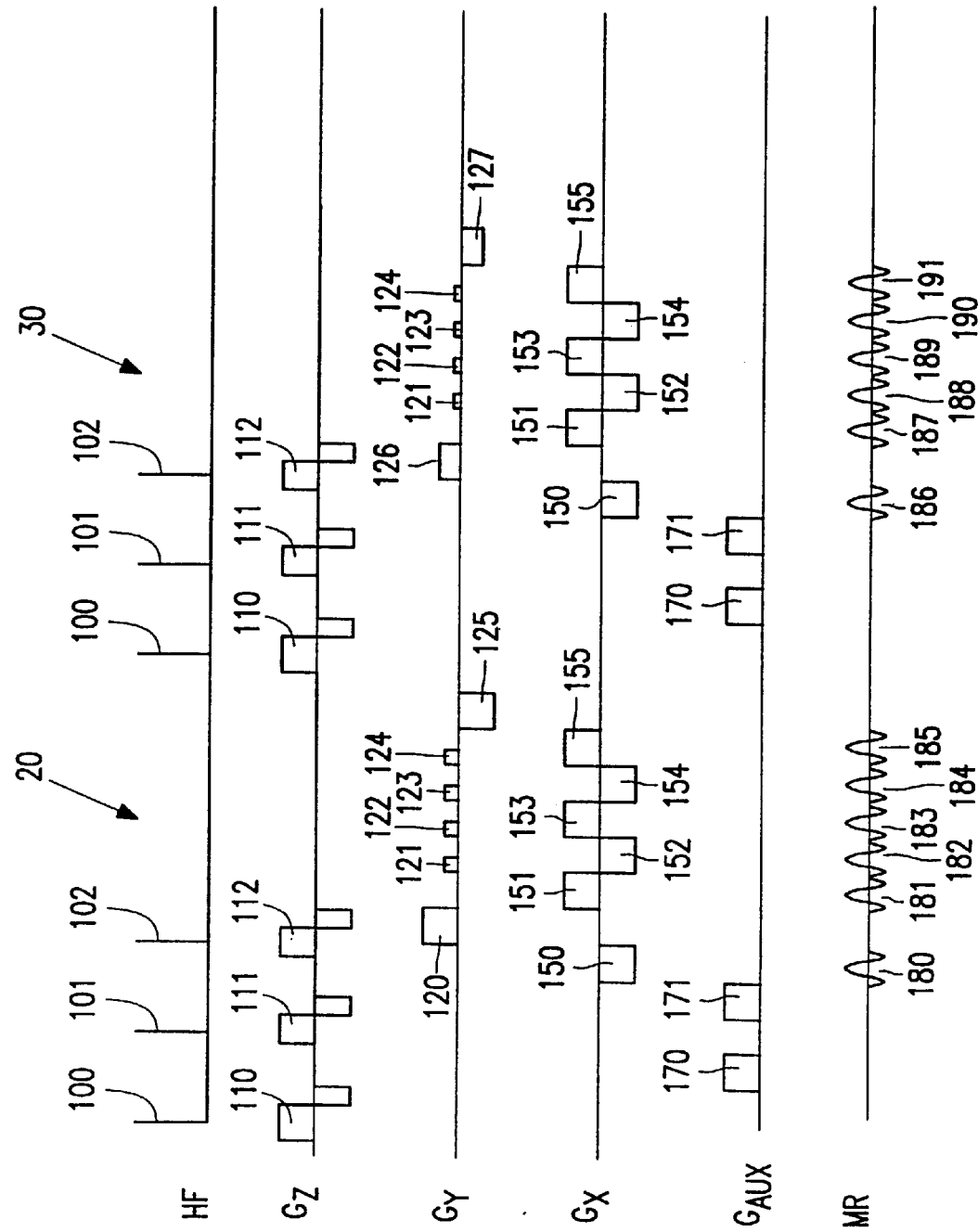
FIG. 2 shows a first diffusion-weighted EPI pulse sequence.

FIG. 2 shows a first pulse sequence 20 and a second pulse sequence 30 which are used in a first version. The first pulse sequence 20 contains an excitation RF pulse and temporary magnetic gradient fields. The first pulse sequence 20 starts by application of a first excitation RF pulse 100, having a flip angle α, and a first selection gradient 110 for excitation of the spins within an object, for example a part of the brain of a human or animal. The flip angle α amounts to, for example 90°. The first selection gradient 110 is a temporary magnetic field which is oriented in the z-direction and has a gradient extending in the z-direction. After slice selection, an additional gradient is applied so as to obtain diffusion weighting. Preferably, the additional gradient $G_{aux}$ contains a bipolar gradient which comprises two equal but temporally shifted parts 170, 171, a first refocusing RF pulse 101 being generated halfway in time between the two parts. The first refocusing RF pulse 101 is rendered selective by application of a second selection gradient 111 which has the same properties as the first selection gradient 110.

The additional gradient $G_{aux}$ is characterized by a b-value which is defined as $$b = \gamma^2 \delta^2 \left(\Delta - \frac{1}{3}\delta\right) G^2,$$

where δ is the duration of a first part 170 of the two equal parts of the additional gradient $G_{aux}$, Δ is the diffusion time, γ is the gyromagnetic constant, and G is the strength of the additional gradient.

Subsequently, a first initial phase encoding gradient 120 and a read out gradient 151 are applied in the pulse sequence 20. The initial phase encoding gradient and the read out gradient are both temporary magnetic gradient fields oriented in the z-direction, their gradients extending mutually perpendicularly and both in a plane perpendicular to the z-axis. Further phase encoding gradients 121, 122, 123, 124, referred to as blips, are applied after the second and further zero crossings of the read gradients 151, 152, 153, 154 in such a manner that the k-space is scanned along lines which are uniformly distributed in the k-space. The MR signals 181, 182, 183, 184, 185 are measured in the presence of the read gradients 151, 152, 153, 154. Subsequent to the read gradient 155, a first rephasing gradient 125 is applied. After that, the pulse sequence 20 is repeated for different values of the first initial phase encoding gradients and the first rephasing gradients in order to measure a complete set of MR signals which correspond to, for example, 64, 128 or 256 lines in the k-space.

In order to compensate the phase variations due to a macroscopic motion of the body, the pulse sequence 20 also includes a first navigator gradient 150 for measuring a first navigator MR signal 180. A second refocusing RF pulse 102 is generated so as to determine the transverse relaxation time $T_2$ of the tissue instead of the time constant $T^*_2$ of the free induction decay signal. The second refocusing RF pulse 102 is rendered selective by application of a third selection gradient 112. Navigator MR signals are known per se from U.S. Pat. No. 4,937,526. Preferably, the first navigator gradient 150 is applied in such a manner that when the first lobe 151 of the read out gradient is described by a function f(t), the first navigator gradient 150 is described by the same function f(t). Furthermore, the first navigator gradient 150 is applied and the second refocusing RF pulse 102 is generated before the first initial phase encoding gradient 120 and after the first additional gradient 171. A first navigator MR signal 180 is measured in the presence of the first navigator gradient 150.

Preferably, the measured first navigator MR signal 180 of the first pulse sequence 20 of a series of pulse sequences for obtaining a set for the reconstruction of an image is used as a reference signal. Subsequently, a phase correction for the measured MR signals 187–191 is derived from a measured second navigator MR signal 186 of a next second pulse sequence 30 and the first navigator MR signal 180. FIG. 2 also shows the second pulse sequence 30 which is identical to the first pulse sequence 20, except for the second initial phase encoding gradient 126 and the second rephasing gradient 127.

Subsequently, the measured first and second navigator MR signals 187–191 are subjected to a 1D Fourier transformation and sequences $\Phi_{nav1}(\phi_{nav1}(x)), \Phi_{nav2}(\phi_{nav2}(x))$ are obtained which contain the phase of the navigator MR signal 186 as a function of the position in the direction of the navigator gradient. Subsequently, the measured MR signals 187–191 are also subjected to a 1D Fourier transformation and a sequence $\Phi_i(\phi_{mr1}(x))$ is obtained which contains the phases of the measured MR signals 187–191 as a function of the distance in the direction of the read out gradient 157–161 which is chosen to be the same as the direction of the first navigator gradient 150 in the present example. Subsequently, a phase correction is derived from the sequences $\Phi_{nav1}$, $\Phi_{nav2}$ for correction of the sequence $\Phi_1(\phi_{mr1}(x))$.

Preferably, a non-linear phase correction is used which is calculated from the first and the second navigator MR signal 180, 186, measured in the first and the second pulse sequence 20, 30, respectively, and is given by the formule $$\phi_{mr0}(x)=\phi_{mr1}(x)+(\phi_{nav2}(x)-\phi_{nav1}(x)),$$

where $\phi_{mr0}(x)$ is the corrected phase, $\phi_{mr1}(X)$ is the phase of a measuring point x of a measured MR signal 187 within the second pulse sequence 30, and $\phi_{nav2}(x)-\phi_{nav1}(x)$ is the correction.

For the imaging of, for example parts of the brain of the human body 7 in the presence of high b-values of the additional gradients, the moduli of the measured navigator MR signals are liable to vary strongly due to the presence of CSF. An major error then occurs in the determination of the phase of the measured navigator MR signal 180, 186 for measuring points with a small value of the modulus relative to the maximum value of the modulus of a measuring point occurring in the measured navigator MR signal 180, 186.

In order to reduce this error, the phases of the measured navigator MR signal 180, 186 are corrected before said non-linear phase correction is determined so as to correct the measured MR signals 187–191. To this end, a corrected phase of the navigator MR signal 180 from a measuring point with a modulus of the measured navigator MR signal 180 which is smaller than a threshold value is determined from the phases of the measured navigator MR signal 180 from different reference measuring points with moduli of the navigator MR signal 180 which are larger than the threshold value. Consequently, in regions where the MR signal has a modulus which is too small, the non-linear interpolation is replaced by a linear or higher-order interpolation of the known phase of the reference measuring points.

According to a first version of the method the corrected phase of the measuring point is determined by linear interpolation of the phases of the measured navigator MR signal 180 from two neighboring reference measuring points, a first neighboring reference measuring point having a co-ordinate in the navigator gradient direction which is smaller than a corresponding co-ordinate of the measuring point whereas another neighboring reference measuring point has a co-ordinate in the direction of the navigator gradient which is larger than the corresponding co-ordinate of the measuring point. In this respect it is assumed that the phase of the navigator MR signal varies as a linear function of the distance in the direction of the navigator gradient. If the phase of the navigator MR signal varies as a non-linear function, the corrected phase can be determined from a higher-order interpolation, for example a third-order interpolation, of the phases of the measured navigator MR signal 180 from different neighboring reference measuring points whose co-ordinate in the navigator gradient direction is smaller than the corresponding co-ordinate of the measuring point and from different neighboring reference measuring points whose co-ordinate in the direction of the navigator gradient is larger than the corresponding co-ordinate of the measuring point. The third-order interpolation function should then be compatible with the known phases of the reference points. Furthermore, preferably half the maximum value of the modulus occurring in the navigator MR signal is chosen as the threshold value $T_r$. The linear interpolation for determining the corrected phase of a measuring point from the phases of the reference measuring points will be described with reference to FIG. 3.

FIG. 3 shows a first line 301 which represents the moduli of different reference measuring points and measuring points of a navigator MR signal. The phases associated with the reference measuring points, i.e. the phase of the navigator MR signal from the measuring points whose modulus is larger than the threshold value Tr, are represented by a second dashed line 302. The threshold value is given by a third horizontal line 303. For a measuring point $x_m$ having a co-ordinate which is situated between $x_2$ and $X_3$ in the direction of the navigator gradient, the corrected phase $\phi(x_m)$ is given by $$\frac{\phi(x_3)-\phi(x_2)}{x_3-x_2}\cdot(x_m-x_2).$$

For a measuring point $x_{m1}$ having a co-ordinate in the direction of the navigator gradient which is smaller than $x_1$, the corrected phase is determined by $$\frac{\phi(x_2) - \phi(x_1)}{x_2 - x_1} \cdot x_{ml}.$$

For a measuring point $X_{m2}$ having a co-ordinate in the direction of the navigator gradient which is larger than $x_4$, the corrected phase is determined from $$\phi(x_4) + \frac{\phi(x_4) - \phi(x_3)}{x_4 - x_3} \cdot x_{m2}.$$

These steps are repeated for all measuring points in the measured navigator MR signals which satisfy the condition that the moduli must be smaller than the threshold value Tr.

A second version of the method enables more accurate determination of the corrected phase of the measuring point $x_m$ of the navigator MR signal 180. According to this second version, the corrected phase of the measured navigator MR signal from the measuring point $x_m$ is determined by interpolation of the mean phase of the phases of the measured navigator MR signal 180 from different reference measuring points $X'_2, X''_2$ whose co-ordinate in a direction of the first navigator gradient 150 is smaller than the corresponding co-ordinate of the measuring point $x_m$, and the mean phase of the phases of the measured first navigator MR signal 180 from different reference measuring points $X'_3, X''_3$ whose co-ordinate in the direction of the navigator gradient is larger than the corresponding co-ordinate of the measuring point $x_m$. This second version of the method will be described in detail with reference to FIG. 4.

FIG. 4 shows a first line 301 which represents the moduli of different measuring points of a navigator MR signal. The phases associated with the reference measuring points, i.e. the phase of the navigator MR signal from the measuring points whose modulus is larger than the threshold value Tr, is represented by a second dashed line 302. The threshold value is represented by a third horizontal line 303. For a measuring point $x_m$ having a co-ordinate between $x_2$ and $x_3$, the corrected phase $\phi(x_m)$ is given by $$\frac{\frac{\phi(x_3) + \phi(x'_3) + \phi(x''_3)}{3} - \frac{\phi(x_2) + \phi(x'_2) + \phi(x''_2)}{3}}{x'_3 - x'_2} \cdot (x_m - x'_2).$$

The described steps are repeated for all measuring points of the measured navigator MR signals 186 in successive pulse sequences required so as to determine a reconstruction set for which the measuring points satisfy the condition that the moduli must be smaller than the threshold value Tr.

Instead of using a method involving EPI pulse sequences, other fast imaging pulse sequences can also be used, for example a Turbo Field Echo (TFE) pulse sequence, a Turbo Spin Echo (TSE) pulse sequence, and a Gradient And Spin Echo (GRASE) pulse sequence. These pulse sequences are inter alia known from EP 604441.

In order to enhance the signal-to-noise ratio in the case of measurements performed on tissue having a longitudinal relaxation time $T_1$ of the magnetization which exceeds the transverse relaxation time $T_2$ of the magnetization, high b-values of the additional gradient are used. These high b-values can be achieved by replacing the first refocusing RF pulse 101, temporally arranged between the two parts of the additional gradient, by two 90° RF pulses 101' which are generated with an interval of duration TM. FIG. 5 shows a third pulse sequence 40 which includes inter alia two 90° RF pulses 101' and the additional gradient 170, 171 and is identical to the pulse sequence 20 of FIG. 2, except for the first refocusing RF pulse 101 and the second selection gradient 111. However, instead of the first refocusing RF pulse the third pulse sequence 40 utilizes two 90° RF pulses which are separated by a period TM. Furthermore, the second selection gradient 111 in the first pulse sequence 20 is replaced by two separate selection gradients 111' in the third pulse sequence 40.

In order to enhance a contrast between different types of tissue in the image, the pulse sequence for measuring the MR signals may also include an inversion recovery RF pulse. Such an inversion recovery RF pulse is generated a period of time TI before the excitation RF pulse. The contrast between different types of tissue in the image can be adjusted by way of the period of time TI. FIG. 6 shows a fourth pulse sequence 50 which is identical to the first pulse sequence 20, except for an inversion recovery RF pulse 104 and a selection gradient 113. For example, a 180° RF pulse is an example of an inversion recovery RF pulse. Instead of a 180° RF pulse, a 90° saturation RF pulse can also be used to achieve a comparable effect on the contrast between the two different types of tissue in the image.

All references cited herein are incorporated herein by reference in their entirety and for all purposes to the same extent as if each individual publication or patent or patent application was specifically and individually indicated to be incorporated by reference in its entirety for all purposes.

It is claimed:

1. A magnetic resonance (MR) method for the imaging of an object arranged in a steady magnetic fields comprising:

exciting spins spins in a part of the object, measuring MR signals along a predetermined trajectory containing a plurality of lines in k-space by application of a read gradient and other gradients, applying both a navigator gradient for the measurement of navigator MR signals and an additional gradient in order to achieve diffusion sensitivity of the MR signal, determining phase corrections for the measured navigator RM signals so ag to orient the measured navigator MR signals, wherein the phase corrections are determined at measuring points where the moduli of measured navigator MR signals are smaller than a threshold value, and wherein the ease corrections are determined from the phases of measured navigator MR signals at different reference measuring points where the moduli exceed the threshold value, determining phase corrections from phases and moduli of the corrected navigator MR signals so as to correct the measured MR signals, and determining an image of the part of the object from the corrected MR signals.

2. A method as claimed in claim 1 wherein determining phase correction of the measured navigator MR signal at a measuring point further comprises interpolating the phases of the measured navigator MR signal from neighboring reference measuring points.

3. A method as claimed in claim 1 wherein determining the phase correction of the measured navigator MR signal at a measuring point further comprises intergolating (i) a mean phase of the phases of the measured navigator MR signal from different reference measuring points for which a value of a co-ordinate in a direction of the navigator gradient is smaller than the corresponding co-ordinate of the measuring point, and (ii) a mean phase of the phases of the measured navigator MR signal from different reference measuring points for which a value of a co-ordinate in a direction of the navigator gradient is larger than the corresponding co-ordinate of the measuring point.

4. A method as claimed in claim 3 wherein the interpolating further comprises linear interpolating or higher-order interpolating.

5. A method as claimed in claim 1 further comprising determining the threshold value by a function of the maximum value of the moduli of the measured navigator MR signal.

6. A method as claimed in claim 1 wherein the additional gradient further comprises a bipolar gradient.

7. A method as claimed in claim 6 further comprising generating a 180° RF pulse at the temporal center of the bipolar gradient.

8. A method as claimed in claim 6 further comprising generating two 90° RF pulses with an interval TM at the temporal center of the bipolar gradient.

9. A method as claimed in claim 1 further comprising generating an inversion recovery RF pulse prior to the step of exciting spins.

10. A magnetic reasonance (MR) device for forming diffusion-weighted images of an object arranged within a steady magnetic field comprising means for sustaining the steady magnetic field;

means for generating RF pulses for exciting MR signals;

means for generating temporary magnetic gradient fields;

a control unit for generating control signals for the means for generating the RF pulses and for the means for generating the temporary magnetic fields in order that the excited MR signals comprise imaging MR signals and navigator MR signals;

means for receiving the excited magnetic resonance signals, and a processing unit for processing the received magnetic resonance signals, the processing unit further comprising means for determining moduli and phases of the received MR signals means for determining a threshold value of the moduli of the received MR navigator signals, and means for determining phase corrections for the recieved navigator MR signals, wherein the phase, corrections are determined at measuring points where the moduli of received navigator signals MR are smaller than the threshold value, and wherein the phase corrections are determined from the phases of recieved navigator MR signals at different reference measuring points where the moduli exceed the threshold value.

* * * * *